United States Patent
Zinn

(10) Patent No.: US 8,609,490 B2
(45) Date of Patent: Dec. 17, 2013

(54) EXTENDED DRAIN LATERAL DMOS TRANSISTOR WITH REDUCED GATE CHARGE AND SELF-ALIGNED EXTENDED DRAIN

(71) Applicant: Micrel, Inc., San Jose, CA (US)

(72) Inventor: David R. Zinn, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 13/873,494

(22) Filed: Apr. 30, 2013

(65) Prior Publication Data

US 2013/0244390 A1   Sep. 19, 2013

Related U.S. Application Data

(62) Division of application No. 13/250,995, filed on Sep. 30, 2011, now Pat. No. 8,450,814.

(51) Int. Cl.
  *H01L 21/336* (2006.01)
  *H01L 21/337* (2006.01)
  *H01L 21/02* (2006.01)
  *H01L 29/66* (2006.01)
  *H01L 27/088* (2006.01)

(52) U.S. Cl.
  USPC ........... 438/267; 438/195; 257/406; 257/335; 257/336; 257/401

(58) Field of Classification Search
  None
  See application file for complete search history.

(56) References Cited

U.S. PATENT DOCUMENTS

| 2004/0256669 A1* | 12/2004 | Hower et al. ................. 257/335 |
| 2007/0228463 A1* | 10/2007 | Cai .............................. 257/343 |
| 2013/0082335 A1 | 4/2013 | Zinn |

* cited by examiner

*Primary Examiner* — Julio J Maldonado
*Assistant Examiner* — Harpreet Singh
(74) *Attorney, Agent, or Firm* — Patent Law Group LLP; David C Hsia

(57) ABSTRACT

A method to form a LDMOS transistor includes forming a gate/source/body opening and a drain opening in a field oxide on a substrate structure, forming a gate oxide in the gate/source/body opening, and forming a polysilicon layer over the substrate structure. The polysilicon layer is anisotropically etched to form polysilicon spacer gates separated by a space in the gate/source/body opening and a polysilicon drain contact in the drain opening. A body region is formed self-aligned about outer edges of the polysilicon spacer gates, a source region is formed self-aligned about inner edges of the polysilicon spacer gates, and a drain region is formed under the polysilicon drain contact and self-aligned with respect to the polysilicon spacer gates. A drift region forms in the substrate structure between the body region and the drain region, and a channel region forms in the body region between the source region and the drift region.

13 Claims, 5 Drawing Sheets

US 8,609,490 B2

EXTENDED DRAIN LATERAL DMOS TRANSISTOR WITH REDUCED GATE CHARGE AND SELF-ALIGNED EXTENDED DRAIN

CROSS-REFERENCE TO RELATED APPLICATIONS

This application is a division of U.S. application Ser. No. 13/250,995, filed on Sep. 30, 2011, entitled "Extended Drain Lateral DMOS Transistor with Reduced Gate Charge and Self-Aligned Extended Drain," which is incorporated herein by reference.

FIELD OF INVENTION

The present disclosure relates to lateral double-diffused metal-oxide-semiconductor (LDMOS or lateral DMOS) transistors and, in particular, to an LDMOS transistor with reduced gate charge and self-aligned extended drain.

DESCRIPTION OF RELATED ART

Lateral double-diffused metal-oxide-semiconductor (LDMOS or lateral DMOS) transistors are commonly used in high-voltage applications (20 to 500 volts) because of their high breakdown voltage characteristics and compatibility with complementary metal-oxide-semiconductor (CMOS) technology for low voltage devices. An LDMOS transistor has a double-diffused source region in a body region, and a gate over the body region to define a channel region. The channel region is separated from an extended drain region by a drift region so the current flows laterally from source to drain.

SUMMARY

In one or more embodiments of the present disclosure, a method to form a lateral double-diffused metal-oxide-semiconductor (LDMOS or lateral DMOS) transistor includes forming a gate/source/body opening and a drain opening in a field oxide on a substrate structure, forming a gate oxide in the gate/source/body opening, and forming a conformal polysilicon layer over the substrate structure. The polysilicon layer is anisotropically etched to form polysilicon spacer gates separated by a space or trench in the gate/source/body opening, and a polysilicon extended drain contact in the drain opening. A body region is formed self-aligned to outer edges of the polysilicon spacer gates, a source region is formed self-aligned to inner edges of the polysilicon spacer gates, and an extended drain region is formed under to the polysilicon extended drain contact and self-aligned with respect to the polysilicon spacer gates. A drift region forms in the substrate structure between the extended drain region and the body region, and a channel region forms in the body region between the source region and the drift region.

In one or more embodiments of the present disclosure, an LDMOS transistor, includes a substrate structure, a field oxide defining a gate/source/body opening and a drain opening on the substrate structure, a gate oxide in the gate/source/body opening, and polysilicon spacer gates on the gate oxide in the gate/source/body opening. The polysilicon spacer gates are separated by a space or trench over a portion of the gate oxide. The transistor further includes a body region self-aligned to outer edges of the polysilicon spacer gates, a source region self-aligned to inner edges of the polysilicon spacer gates, an extended drain region formed under the polysilicon extended drain contact and self-aligned with respect with one of the polysilicon spacer gate, a drift region in the substrate structure between the extended drain region and the body region, and a channel region being formed in the body region between the source region and the drift region.

BRIEF DESCRIPTION OF THE DRAWINGS

In the drawings.

Use of the same reference numbers in different figures indicates similar or identical elements.

DETAILED DESCRIPTION

Figure 1:
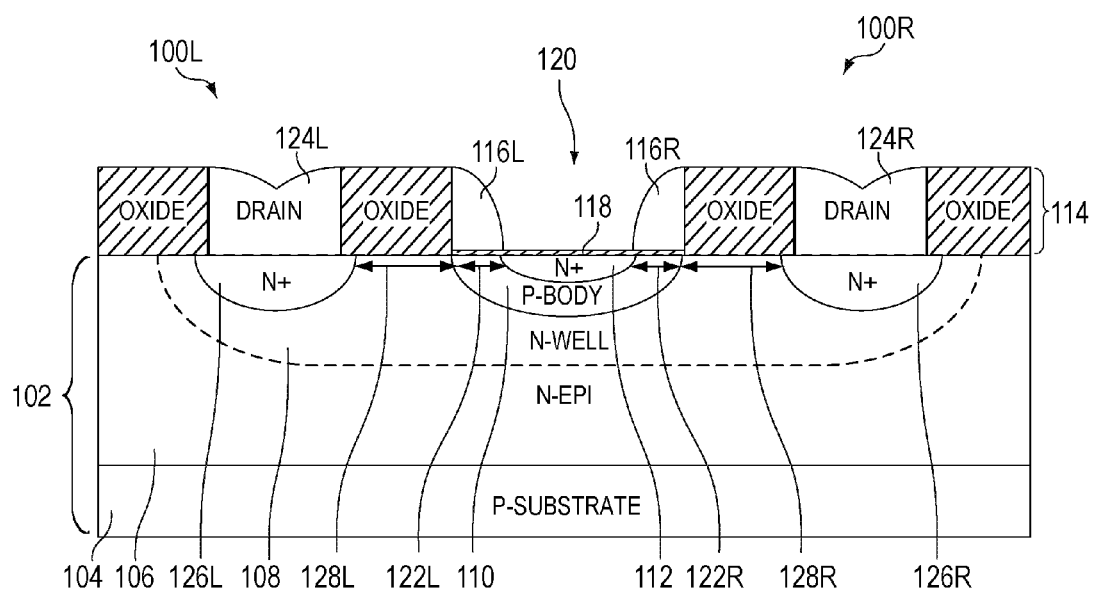
FIG. 1 shows a cross-sectional view of a pair of lateral double-diffused metal-oxide-semiconductor (LDMOS or lateral DMOS) transistors.

FIG. 1 shows a cross-sectional view of a pair of lateral double-diffused metal-oxide-semiconductor (LDMOS or lateral DMOS) transistors 100L and 100R in one or more embodiments of the present disclosure. LDMOS transistors 100L and 100R are formed in a substrate structure 102. Substrate structure 102 includes a P-type substrate 104, an N-type epitaxial layer 106 formed on the substrate, and optionally an N-type well 108 formed in the epitaxial layer. N-well 108 may be more heavily doped than the N-epitaxial layer 106. The use of N-well 108 helps to reduce drain resistance and shape the electric field to increase source-drain breakdown voltage.

LDMOS transistors 100L and 100R share a P-type body region 110 formed in N-epitaxial layer 106 or N-well 108 if present, and an N-type heavily doped source region 112 formed in the P-body region. P-body region 110 is self-aligned to outer edges 702L and 702R (FIG. 7) of polysilicon sidewall spacers 116L and 116R, respectively. Polysilicon sidewall spacers 116L and 116R are formed on sidewalls 404L and 404R (FIG. 4), respectively, of an opening 402 (FIG. 4) in a field oxide 114 on substrate structure 102. N+ source region 112 is self-aligned to inner edges 802L and 802R (FIG. 8) of polysilicon sidewall spacers 116L and 116R. Polysilicon sidewall spacers 116L and 116R also serve as gate conductors for LDMOS transistors 100L and 100R, respectively, and are hereafter referred to as "polysilicon spacer gates." As opening 402 is involved in forming polysilicon spacer gates 116L, 116R, N+ source region 112, and P-body region 110, it is hereafter referred to as "gate/source/body opening."

Polysilicon spacer gates 116L and 116R are formed on a gate oxide 118 over P-body region 110. Polysilicon spacer gates 116L and 116R may be formed by depositing a conformal polysilicon layer and then anisotropically etching the polysilicon layer. The polysilicon layer is N-type and heavily doped by diffusion (after deposition or in-situ) or ion implantation. After etching, polysilicon spacer gates 116L and 116R are separated by a space or a trench 120 and have a rounded profile. Two channel regions 122L and 122R are formed in P-body region 110 under polysilicon spacer gates 116L and 116R, respectively. The lengths of channels 122L and 122R can be determined by factors including the energy of the body implant and the polysilicon spacer gates' profile (including the width at the base of a polysilicon spacer gate), the latter of which is determined by the thickness of the polysilicon layer and the etching time. For example, lengths of channels 122L and 122R can be decreased by reducing the energy of the implant.

Polysilicon extended drain contacts 124L and 124R are defined through drain openings 406L and 406R (FIG. 4), respectively, in field oxide 114 away from polysilicon spacer gates 116L and 116R, respectively. Polysilicon extended drain contacts 124L and 124R may be formed concurrently with polysilicon spacer gates 116L and 116R using the same deposition of the conformal polysilicon layer and the same anisotropic etch.

N-type heavily doped extended drain regions 126L and 126R are formed under polysilicon extended drain contacts 124L and 124R, respectively, away from channels 122L and 122R, respectively. N+ extended drain regions 126L and 126R is formed through auto-doping from polysilicon extended drain contacts 124L and 124R. A N-type "drift" region 128L is formed in N-epitaxial layer 106 or N-well 108, if present, between N+ extended drain region 126L and channel region 122L. A N– drift region 128R is formed in N-epitaxial layer 106 or N-well 108, if present, between N+ extended drain region 126R and channel region 122R.

Drift regions 128L and 128R allow the drain voltage to drop sufficiently to prevent (1) impact-ionization between N+ extend drain regions 126L, 126R and P-body region 110 and (2) Fowler-Nordheim tunneling between the N+ extended drain regions and polysilicon spacer gates 116L, 116R in higher voltage applications. The length of drift regions 128L and 128R can be tuned to achieve the needed operating voltage range for LDMOS transistors 100L and 100R. When present, N-well 108 lowers the resistance of drift regions 128L and 128R.

One advantage of the present disclosure stems from the formation of polysilicon spacer gates 116L and 116R. The size of polysilicon spacer gates 116L and 116R is defined by the thickness of deposited polysilicon layer and the duration of the anisotropic etch instead of a photo mask. As both deposition and etching can be precisely controlled, a smaller feature size can be achieved compared to standard photolithographic techniques. For example, using a 0.35 micron process, 0.2 to 0.25 micron polysilicon spacer gates 116 and 116R may be obtained by depositing and etching a 2,000 to 2,500 angstroms polysilicon layer compared to 0.35 micron polysilicon gates obtained using photolithographic techniques. The smaller feature size results in a more compact design and less gate overlap capacitance. The benefit of the aforementioned is a more area-efficient device with significantly reduced gate charge compared to previous designs. The reduction in gate charge is especially important in switching applications where energy is lost from a transistor being constantly turned on and off.

Another advantage of the present disclosure stems from the formation of N+ extended drain regions 126L and 126R. Conventionally a masking step is used to form the N+ extended drain regions in an LDMOS transistor as the N+ extended drain regions are not self-aligned to the gate of the LDMOS transistor. Due to mask-making tolerances and photo misregistration, additional length is added to the drift regions. In the present disclosure, drain openings 406L, 406R (FIG. 4) and gate/source/body opening 402 (FIG. 4) are defined with a single mask, thereby avoiding the overhead inherent in the prior devices. The use of the single mask also reduces variations in N+ extended drain regions 126L and 126R from using multiple masks due to mask-making tolerances and photo misregistration. This is important in applications where device ruggedness and matching are critical.

Figure 2:
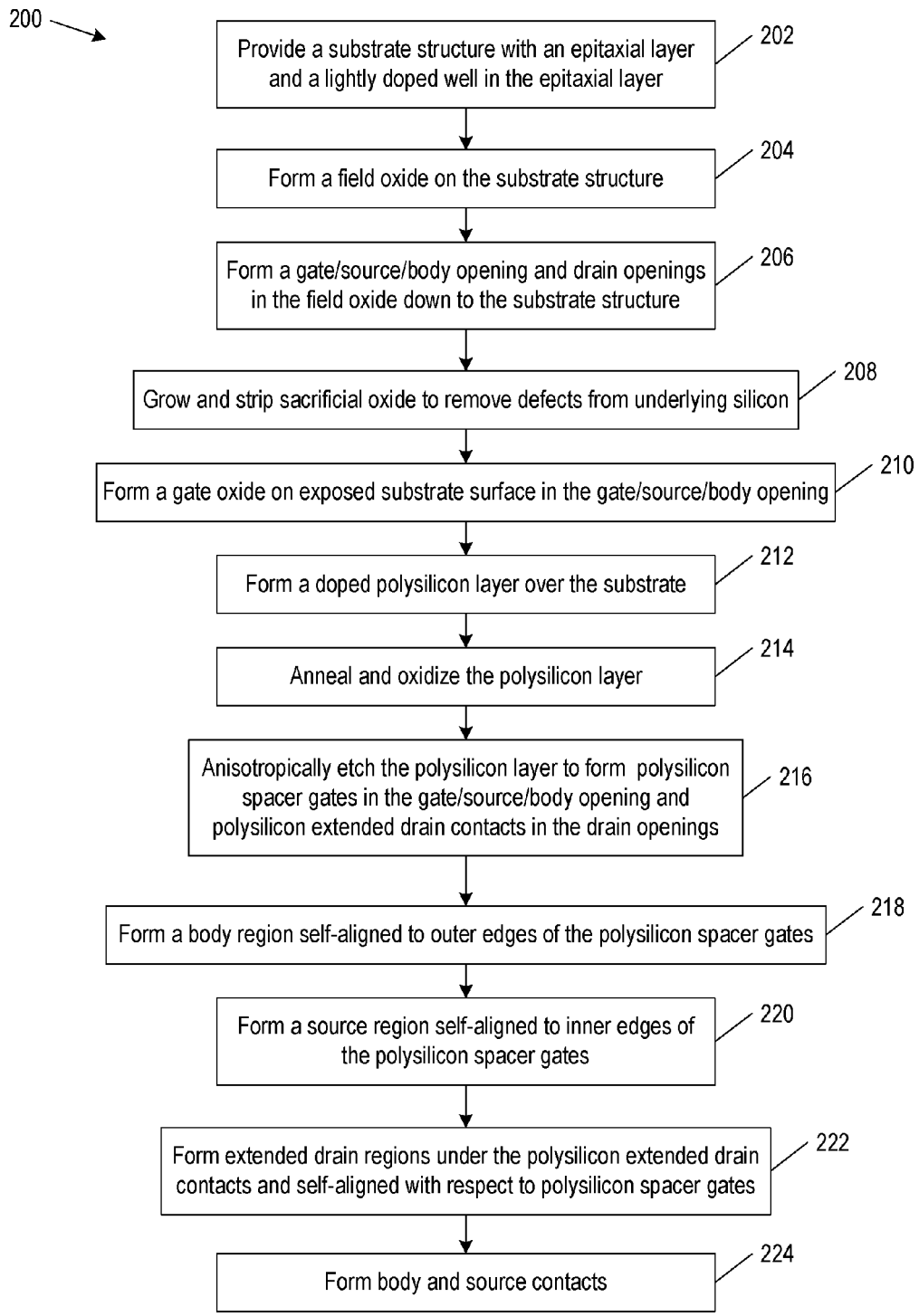
FIG. 2 is a flowchart of a fabrication process for the LDMOS transistors of FIG. 1.

FIG. 2 is a flowchart of a fabrication process 200 for lateral DMOS transistors 100L and 100R of FIG. 1 in one or more embodiments of the present disclosure. Process 200 is compatible with CMOS process so lateral DMOS transistors 100L and 100R may be made alongside with CMOS devices. Process 200 may include one or more operations, functions, or actions as illustrated by one or more blocks. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Process 200 is explained with the help of the other figures showing progression through the method.

Figure 3:
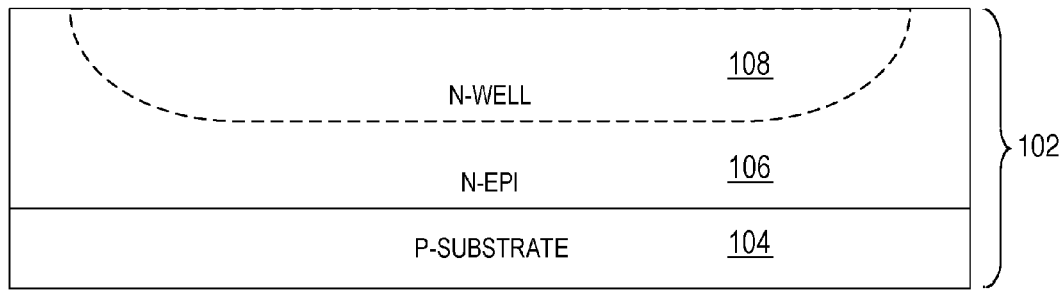
FIG. 3 is a cross-sectional view of a substrate structure in the fabrication process of FIG. 2.

Process 200 may start with block 202. In block 202, as illustrated in FIG. 3, substrate structure 102 with P-substrate 104, N-epitaxial layer 106, and optional N-well 108 is provided. Block 202 may be followed by block 204.

Figure 4:
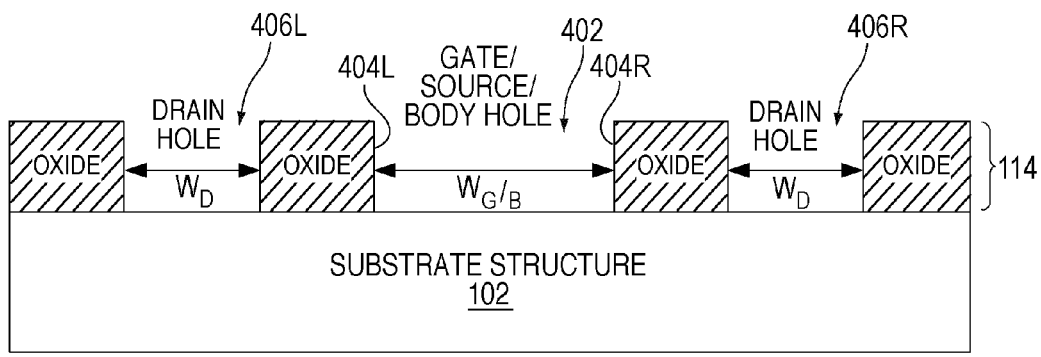
FIG. 4 is a cross-sectional view of a semiconductor structure in the fabrication process of FIG. 2 where gate/source/body and drain openings are defined in a field oxide on the substrate structure.

In block 204, as illustrated in FIG. 4, a layer of field oxide 114 is formed on substrate structure 102. Field oxide 114 may be silicon dioxide thermally grown or deposited on N-epitaxial layer 106 or N-well 108 if present. Block 204 may be followed by block 206.

In block 206, as illustrated in FIG. 4, gate/source/body opening 402 and drain openings 406L and 406R are formed in field oxide 114 down to substrate structure 102. Openings 402, 406L, and 406R are concurrently formed using a single mask. Openings 402, 406L, and 406R may be formed by photolithography using photo masking and etching. Gate/source/body opening 402 is defined over an active area for the gate, the source, and the body on substrate structure 102, and drain openings 406L and 406R are formed over active areas for extended drains on the substrate structure. In one embodiment, openings 402, 406L, and 406R are rectangular openings with the same length but different widths. For example, gate/source/body opening 402 has a width of about 1.4 micron, and drain openings 406L and 406R have a width of about 0.4 micron. In this embodiment, gate/source/body opening 402 has opposing sidewalls 404L and 404R along its length. In an alternative embodiment, gate/source/body opening 402 is a circular opening and drain openings 406L and 406R are part of an annular slot around the circular opening. In this embodiment, opening 402 has a continuous sidewall 404L, 404R. Block 206 may be followed by block 208.

In block 208, a layer of sacrificial oxide is thermally grown and then stripped to remove defects from the silicon exposed through openings 402, 406L, and 406R. Block 208 may be followed by block 210.

Figure 5:
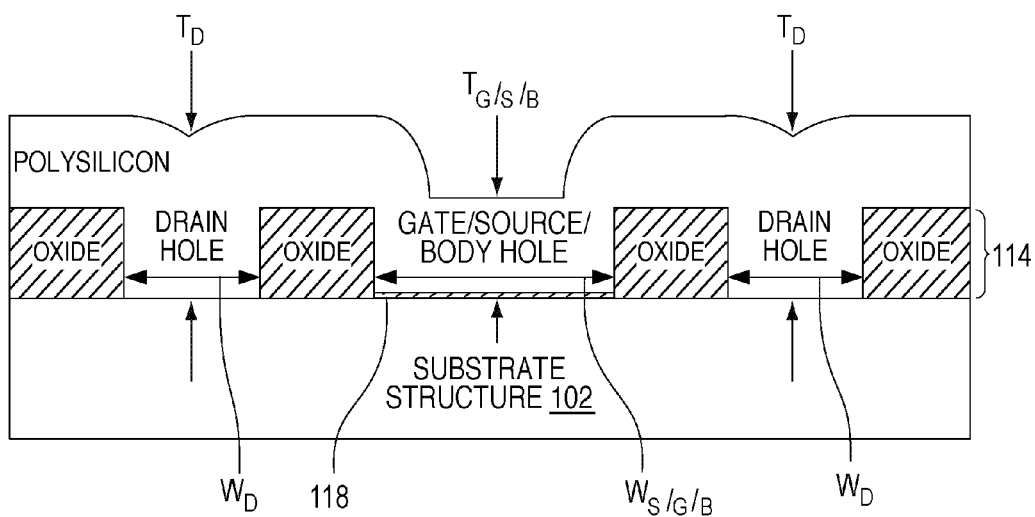
FIG. 5 is a cross-sectional view of a semiconductor structure in the fabrication process of FIG. 2 where a conformal polysilicon layer is formed over the substrate structure.

In block 210, as illustrated in FIG. 5, gate oxide 118 is formed on the silicon exposed through gate/source/body opening 402 (FIG. 4). Gate oxide 118 may be formed by thermally growing a layer of silicon dioxide on the silicon exposed by openings 402, 406L, and 406R, and removing the gate oxide material in the drain openings by photolithography using photo masking and etching. Block 210 may be followed by block 212.

In block 212, as illustrated in FIG. 5, a layer of conformal polysilicon 502 is formed over substrate structure 102. Polysilicon layer 502 covers field oxide 114, gate/source/body opening 402 (FIG. 4), and drain openings 406L and 406R (FIG. 4). Polysilicon layer 502 has a minimum thickness $T_{G/S/B}$ in gate/source/body opening 402 less than a width $W_{G/S/B}$ of the gate/source/body opening. This relationship between thickness $T_{G/S/B}$ and width $W_{G/S/B}$ allows part of gate oxide 118 in gate/source/body opening 402 to be exposed when polysilicon layer 502 is later etched. Polysilicon layer 502 has a minimum thickness $T_D$ in drain openings 406L and 406R greater than a width $W_D$ of the drain openings. This relationship of thickness $T_D$ and width $W_D$ prevents the underlying silicon in drain openings 406L and 406R from being exposed when polysilicon layer 502 is later etched. Block 212 may be followed by block 214.

In block 214, polysilicon layer 502 is annealed and oxidized. Block 214 may be followed by block 216.

Figure 6:
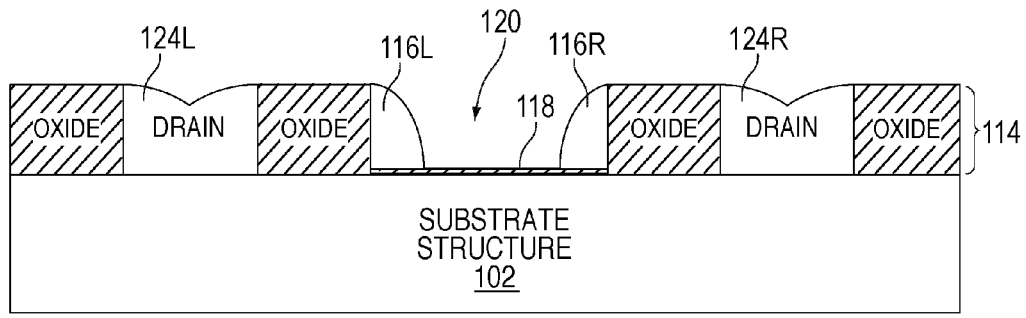
FIG. 6 is a cross-sectional view of a semiconductor structure in the fabrication process of FIG. 2 where the polysilicon layer has been etched to form polysilicon spacer gates and extended drain contacts.

In block 216, as illustrated in FIG. 6, polysilicon layer 502 is anisotropically etched to form polysilicon spacer gates 116L, 116R in gate/source/body opening 402 (FIG. 4) and polysilicon extended drain contacts 124L, 124R in drain openings 406L, 406R (FIG. 4). Polysilicon spacer gates 116L, 116R and polysilicon extended drain contacts 124L, 124R are precisely aligned as gate/source/body opening 402 and drain openings 406L, 406R are formed using a single photo mask. Polysilicon layer 502 may be anisotropically etched using reactive ion etching. The etching of polysilicon layer 502 exposes the top of field oxide 114. The etching of polysilicon layer 502 also exposes part of gate oxide 118 near the middle of gate/source/body opening 402 so polysilicon spacer gates 116L and 116R are separated by space or trench 120. Note that minimum thickness $T_{G/S/B}$ (FIG. 5) of polysilicon layer 502 in gate/source/body opening 402 and the duration of the anisotropic etch determine the profile, including the base width, of polysilicon spacer gates 116L and 116R. Block 216 may be followed by block 218.

Figure 7:
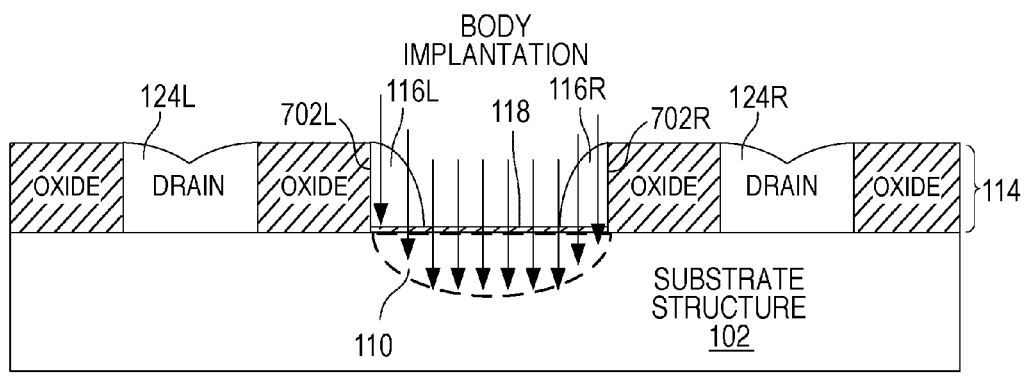
FIG. 7 is a cross-sectional view of a semiconductor structure in the fabrication process of FIG. 2 where a body region is formed.

In block 218, as illustrated in FIG. 7, P-body region 110 is formed in substrate structure 102. P-body region 110 is self-aligned to outer edges 702L and 702R of polysilicon spacer gates 116L and 116R, respectively. P-body region 110 may be doped by forming a photo mask and applying high energy ion implantation (deep implantation) followed by annealing. The ion implantation has a dose and an energy that allows the ions to penetrate the underlying silicon in regions where polysilicon spacer gates 116L and 116R are not present and where the polysilicon spacer is thin. Block 218 may be followed by block 220.

Figure 8:
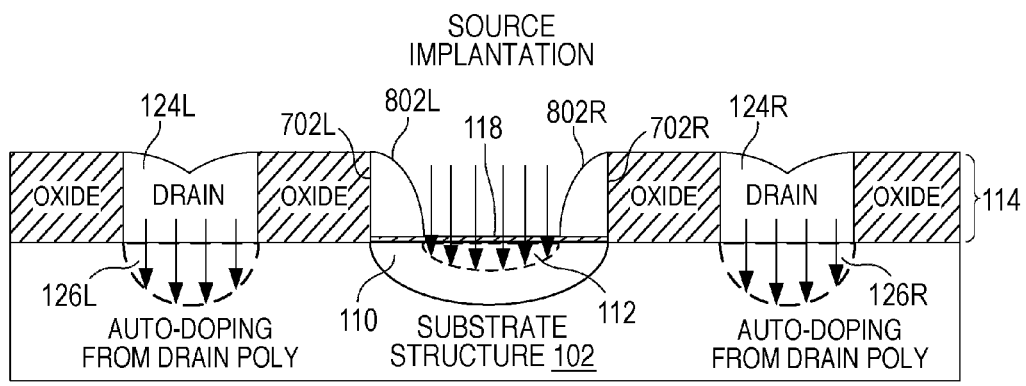
FIG. 8 is a cross-sectional view of a semiconductor structure in the fabrication process of FIG. 2 where source and extended drain regions are formed.

In block 220, as illustrated in FIG. 8, N+ source region 112 is formed in P-body region 110. N+ source region 112 is self-aligned to inner edges 802L and 802R of polysilicon spacer gates 116L and 116R, respectively. N+ source region 112 may be doped by forming a photo mask and applying low energy ion implantation (shallow implantation) followed by annealing. The ion implantation has a dose and an energy that allows the ions to penetrate the underlying silicon in regions where polysilicon spacer gates 116L and 116R are not present. Block 220 may be followed by block 222.

In block 222, as illustrated in FIG. 8, N+ extended drain regions 126L and 126R are formed in substrate structure 102 under polysilicon extended drain contacts 124L and 124R, respectively. N+ extended drain regions 126L and 126R are formed through auto-doping from polysilicon extended drain contacts 124L and 124R, respectively, which are directly contacting the silicon. Note that the auto-doping may naturally result from thermal cycles that occur at various points of fabrication process 200. N+ extended drain regions 126L and 126R are self-aligned with respect to polysilicon spacer gates 116L, 116R as the polysilicon spacer gates and polysilicon extended drain contacts 124L and 124R are formed using a single mask. Block 222 may be followed by block 224.

In block 224, body and source contacts are formed by etching openings in field oxide 114 to access body 110 and source region 112 and depositing metal in the openings.

Figure 9:
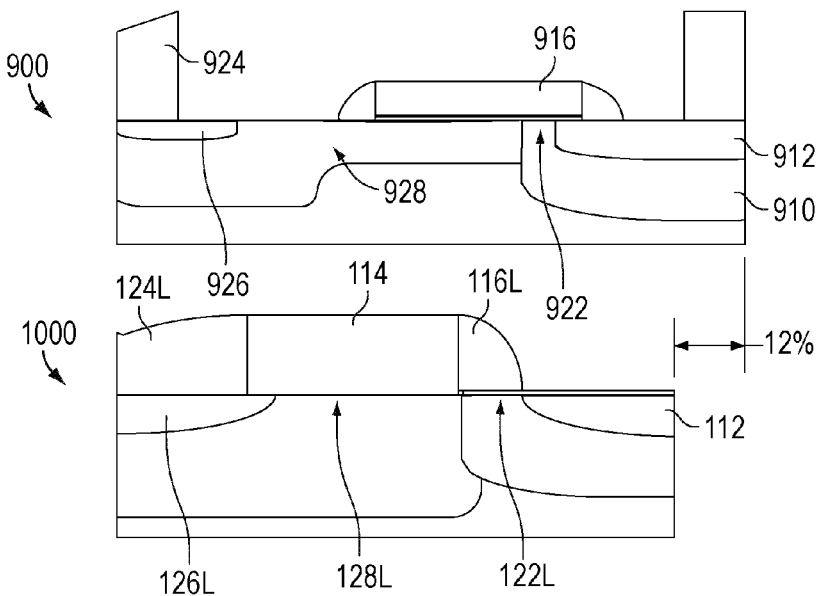
FIG. 9 is a cross-sectional comparison between a conventional LDMOS and the LDMOS of FIG. 1.

FIG. 9 is a cross-sectional comparison between a conventional LDMOS 900 and LDMOS 100L of FIG. 1 in one or more embodiments of the present disclosure. Conventional LDMOS 900 includes a body region 910, a source region 912 in the body region, a gate 916 over the body region, an extended drain contact 924, an extended drain region 926, and a drift region 928. Assuming devices 900 and 100L are built with the same 0.35 micron process, LDMOS 100L may offer a reduction in device pitch of about 12% compared to conventional LDMOS 900.

Figure 10:
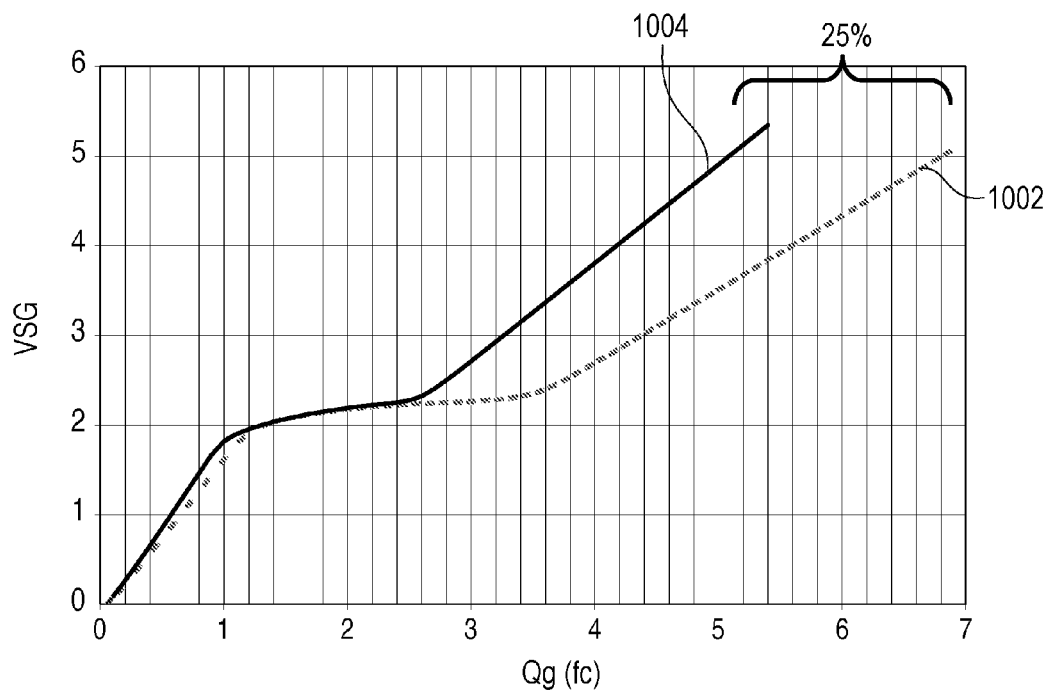
FIG. 10 is a chart demonstrating a reduction in gate charge between the conventional LDMOS of FIG. 9 and the LDMOS of FIG. 1, all arranged in accordance with embodiments of the invention.

FIG. 10 is a chart demonstrating a reduction in gate charge between lateral DMOS 900 of FIG. 9 and LDMOS 100L of FIG. 1 in one or more embodiments of the present disclosure. Line 1002 represents the voltage gate to source (VGS) over gate charge (Qg) of LDMOS 900, and line 1004 represents the VGS over Qg of LDMOS 100L. The reduction in gate size in LDMOS 100L may offer a reduction of about 25% in gate charge compared to conventional LDMOS 900.

Various other adaptations and combinations of features of the embodiments disclosed are within the scope of the invention. For example, P-channel LDMOS transistors 100L and 100R may be formed using P-drift regions with P-doped polysilion. Numerous embodiments are encompassed by the following claims.

What is claimed is:
1. A method to form a lateral double-diffused metal-oxide-semiconductor transistor, comprising:
   forming a field oxide on a substrate structure;
   using a single mask, concurrently forming a gate/source/body opening and a drain opening in the field oxide down to the substrate structure;
   forming a gate oxide on exposed substrate structure surface in the gate/source/body opening;
   forming a polysilicon layer over the substrate structure, the polysilicon layer covering the field oxide, the gate/source/body opening, and the drain opening, the polysilicon layer having a minimum thickness in the gate/source/body opening less than a width of the gate/source/body opening;
   anisotropic ally etching the polysilicon layer down to the field oxide and a portion of the gate oxide, thereby forming polysilicon spacer gates in the gate/source/body opening and a polysilicon extended drain contact in the drain opening, the polysilicon spacer gates being separated by a space over a portion of the gate oxide, the polysilicon spacer gates having base widths that are determined by the minimum thickness of the polysilicon layer in the gate/source/body opening and a duration of the anisotropic etching;

forming a body region of a first conductivity in the substrate structure, the body region being self-aligned about outer edges of the polysilicon spacer gates;

forming a source region of a second conductivity in the body region, the source region being self-aligned about inner edges of the polysilicon spacer gates;

forming an extended drain region of the second conductivity in the substrate structure, the extended drain region being located under the polysilicon extended drain contact and self-aligned with respect to the polysilicon spacer gates, a drift region being formed in the substrate structure between the extended drain region and the body region, and a channel region being formed in the body region between the source region and the drift region.

2. The method of claim 1, wherein the polysilicon layer having a minimum thickness in the drain opening greater than a width of the drain opening.

3. The method of claim 1, wherein the extended drain region is formed through auto-doping from the polysilicon extended drain contact.

4. The method of claim 1, further comprising forming a body contact to the body-region and a source contact to the source region.

5. The method of claim 1, further comprising:

forming an other drain opening in the field oxide concurrently with forming the gate/source/body opening and the drain opening, wherein:

forming the polysilicon layer over the substrate structure includes covering the other drain opening; and anisotropically etching the polysilicon layer includes forming an other polysilicon extended drain contact in the other drain opening; and forming an other extended drain region of the second conductivity in the substrate structure, the other extended drain region being located under the other polysilicon extended drain contact, another drift region being formed in the substrate structure between the other extended drain region and the body region, and an other channel region being formed in the body region between the source region and the other drift region.

6. The method of claim 1, wherein the gate/source/body opening and the drain opening comprise rectangular openings, and the polysilicon spacer gates are arranged against opposing sidewalls of the gate/source/body opening.

7. The method of claim 6, wherein the polysilicon spacer gates each comprises a rounded profile.

8. The method of claim 7, wherein the polysilicon spacer gates comprise base widths of about 0.2 to 0.25 microns.

9. The method of claim 1, prior to forming the field oxide, further comprising:

forming the substrate structure, comprising:

growing an epitaxial layer of the second conductivity on a substrate of a first conductivity; and forming a well of the second conductivity in the epitaxial layer, wherein the source region, the body region, and the extended drain region are located in the well.

10. The method of claim 1, wherein forming the drain opening and the gate/source/body opening comprises:

masking the field oxide and removing portions of the field oxide over a gate/source/body area and an extended drain area on the substrate structure.

11. The method of claim 1, further comprising, after forming the drain opening and the gate/source/body opening:

growing and removing a sacrificial oxide on exposed substrate structure surfaces in the gate/source/body opening and the drain opening.

12. The method of claim 1, wherein forming the gate oxide comprises:

forming a gate oxide layer on exposed substrate structure surfaces in the gate/source/body opening and the drain opening; and removing a portion of the gate oxide layer in the drain opening.

13. The method of claim 1, further comprising, after forming the polysilicon layer and before anisotropically etching the polysilicon layer:

annealing and oxidizing the polysilicon layer.

* * * * *